United States Patent
Weiss et al.

(10) Patent No.: US 8,710,348 B2
(45) Date of Patent: Apr. 29, 2014

(54) STACKED THIN-FILM SUPERLATTICE THERMOELECTRIC DEVICES

(76) Inventors: Dirk N. Weiss, Kenmore, WA (US); Thomas D. Radcliff, Vernon, CT (US); Rhonda R. Willigan, Manchester, CT (US)

( * ) Notice: Subject to any disclaimer, the term of this patent is extended or adjusted under 35 U.S.C. 154(b) by 881 days.

(21) Appl. No.: 12/288,560

(22) Filed: Oct. 21, 2008

(65) Prior Publication Data
US 2010/0095997 A1 Apr. 22, 2010

(51) Int. Cl.
*H01L 35/16* (2006.01)
(52) U.S. Cl.
USPC .......................... 136/238; 136/237
(58) Field of Classification Search
USPC ......... 136/240, 241, 242, 243, 260, 263, 264, 136/238, 237; 257/292, 293
See application file for complete search history.

(56) References Cited

U.S. PATENT DOCUMENTS

| | | | | |
|---|---|---|---|---|
| 6,071,351 A * | 6/2000 | Venkatasubramanian | .... | 118/725 |
| 6,083,770 A * | 7/2000 | Sato et al. | ........................ | 438/54 |
| 6,894,215 B2 * | 5/2005 | Akiba | ............................ | 136/208 |
| 2003/0099279 A1 * | 5/2003 | Venkatasubramanian et al. | .............................. | 374/179 |
| 2003/0230332 A1 * | 12/2003 | Venkatasubramanian et al. | .............................. | 136/205 |
| 2004/0042181 A1 * | 3/2004 | Nagasaki | ....................... | 361/725 |
| 2006/0097241 A1 * | 5/2006 | Harris et al. | ....................... | 257/9 |

FOREIGN PATENT DOCUMENTS

JP       0125451       *  8/1989  .............. H01L 23/38

OTHER PUBLICATIONS

JP 01205451, Yamada et al., Human Translation, Aug. 1989.*
McGraw-Hill Staff, McGraw Hill Dicitionary of Scientific and Technical Terms, Sixth Ed., Definition of "Superlattice", p. 2071, Pub. Oct. 2002.*

* cited by examiner

*Primary Examiner* — Devina Pillay

(57) ABSTRACT

A thermoelectric device (31) includes a plurality of alternating p-type and n-type semiconductor thermoelectric elements (32, 34, 36; 33, 35 37) the elements (32-37) being separated by electrically and thermally conductive interconnects (40-45), alternating interconnects (40-44) extending in an opposite direction from interconnects (41-45) interspersed therewith. Each thin-film element comprises several hundred thermoelectric alloy A superlattice thin-films interspersed with several hundred thermoelectric alloy B superlattice thin-films, the thin-film elements being between 5 and 25 microns thick and preferably over 10 microns thick. The thin-film elements may be interspersed with opposite type thin-film elements or with opposite type bulk elements (33a, 34a). The interconnects are preferably joined to the elements by diffusion bonding.

14 Claims, 4 Drawing Sheets

STACKED THIN-FILM SUPERLATTICE THERMOELECTRIC DEVICES

TECHNICAL FIELD

N-type and p-type superlattice thin-film and/or bulk thermoelectric semiconductor elements are interspersed in a stack with electrically and thermally conductive interconnects disposed between adjacent elements. The interconnects form thermoelectric couples with elements on opposite sides thereof. Elements of adjacent couples alternate between p-type and n-type; each adjacent pair including at least one thin-film element. Each thin-film element is formed by a large number of superlattice thin-film layers, there being layers of one alloy interspersed with layers of another alloy; the alloys for p-type devices being different from the alloys for n-type elements.

BACKGROUND ART

Thermoelectric cooling and heating comprises use of p-type and n-type thermoelectric, semiconductor materials interspersed with each other, and formed into couples by electrically conductive interconnects.

In conventional devices, the interconnects extend from the top of a first element to the top of a second, adjacent element, from the bottom of the second element to the bottom of a third, adjacent element, from the top of the third element to the top of a fourth, adjacent element, and so forth. Each element and each interconnect are both insulated from adjacent elements and interconnects, respectively by space, or by material which is both electrically and thermally insulative. The top and bottom interconnects are typically soldered to respective electrically insulative, thermally conductive top headers and bottom headers.

In "stacked" devices on the other hand, the p-type devices are separated from interspersed n-type devices by electrically and thermally conductive interconnects; the even numbered interconnects extend outwardly in a first direction, and the odd numbered interconnects extend outwardly in a second direction opposite to the first direction. The p-type and n-type elements contacting each interconnect form a thermoelectric couple therewith.

Both the conventional devices and the stacked devices are illustrated in U.S. Pat. No. 5,254,178, both using bulk elements; FIG. 18 illustrates conventional devices and FIG. 1 illustrates stacked devices.

Thermoelectric device performance depends on the well-known thermoelectric figure of merit, ZT, of thermoelectric elements, which may be expressed $ZT=(\alpha^2 T/\rho K_t)$ where α=Seebeck coefficient
T=temperature (K)
ρ=electrical resistivity
$K_t$=thermal conductivity Traditionally, the thermoelectric elements (sometimes "T. E." hereinafter) configured in a conventional device consisted of homogeneous (or bulk) semiconductor alloys of the p-type and of the n-type. Bulk elements with a ZT of about 1.0 provided an overall device ZT of about 0.7-0.9. Then, thin-film superlattice thermoelectric elements were shown to have, at the element level, higher figures of merit, which translate into a higher coefficient of performance (COP), than do the homogenous (bulk) elements at the element level. However, it has been shown that the thin-film superlattice elements, having an average element ZT of about 2, when configured in a conventional device, provide an overall figure of merit of about 0.5, and therefore do not improve overall device COP.

SUMMARY

Thin film devices have interrelated properties which it is believed interact to render them undesirable in stacked devices. Heat flux becomes greater as the thickness of thermoelectric material is reduced. This causes significant heat management issues, and is believed to be the cause for the overall device figure-of-merit value being only 0.5 in the conventional device architecture. Increased heat flux causes parasitic losses and temperature drops in the wrong places, i.e., at locations other than across the T.E. element, which is the most desired location for the temperature drop to occur. It was therefore considered counterintuitive to use thin-film elements in stacked devices.

It is believed, though not known for sure, that arrangement of thin-film superlattice elements within a stacked device configuration mitigates these thermal management issues.

We have determined that incorporating superlattice thin-film elements, alternating with adjacent thin-film elements or bulk elements, in stacked thermoelectric device configurations, results in overall device figures of merit which are higher than those attainable in conventional devices. We have also discovered that use of a diffusion bonding process to join the elements with the interconnects further increases the overall figure of merit of stacked devices employing superlattice thin-film elements. Furthermore, we have found that the overall figure of merit of stacked thermoelectric devices employing superlattice thin-film elements is increased by increasing the thickness of the alloy films. Use of the stacked devices eliminates the need for the ceramic headers used in conventional devices.

A plurality of thin-film superlattice semiconductor elements of the p-type and/or of the n-type are arranged serially, the n-type being interspersed with the p-type, each thin-film superlattice element being interspersed with either another thin-film superlattice element or a bulk thermoelectric alloy element, each n-type element being separated from an adjacent p-type element by a thermally and electrically conductive interconnect, the interconnects extending in one direction being interleaved with interconnects extending in a second direction opposite said one direction, such that the odd numbered interconnect structures extend in said one direction and the even numbered interconnect structures extend in said opposite direction, each thin-film element comprising many hundreds of thin-film layers, there being layers of a first thermoelectric alloy (referred to as alloy A) interspersed with layers of second thermoelectric alloy (referred to as alloy B) in each element, the thermoelectric alloys forming the layers in p-type semiconductors being different from the thermoelectric alloys forming layers in n-type semiconductors.

Optionally, the superlattice film thickness in the direction of electron flow, of each thin-film alloy, in every pair of films of each thin-film element, is at least about 5 microns, and may extend to about 25 microns. While it is understood that it is currently difficult to provide thicker superlattice films (that is, above about 10 or 12 microns), preparation of thermoelectric films above 12 microns in thickness will provide better devices.

Bulk thermoelectric alloy elements that may be interspersed with thin-film elements may be either homogeneous (single alloy) or heterogeneous (a second alloy dispersed within a first alloy).

Optionally, devices are formed with interconnects joined to elements by means of diffusion bonding to further increase the overall figure of merit of stacked thermoelectric devices employing superlattice thin-film elements.

Other variations will become more apparent in the light of the following detailed description of exemplary embodiments, as illustrated in the accompanying drawings.

MODE(S) OF IMPLEMENTATION

Figure 1:
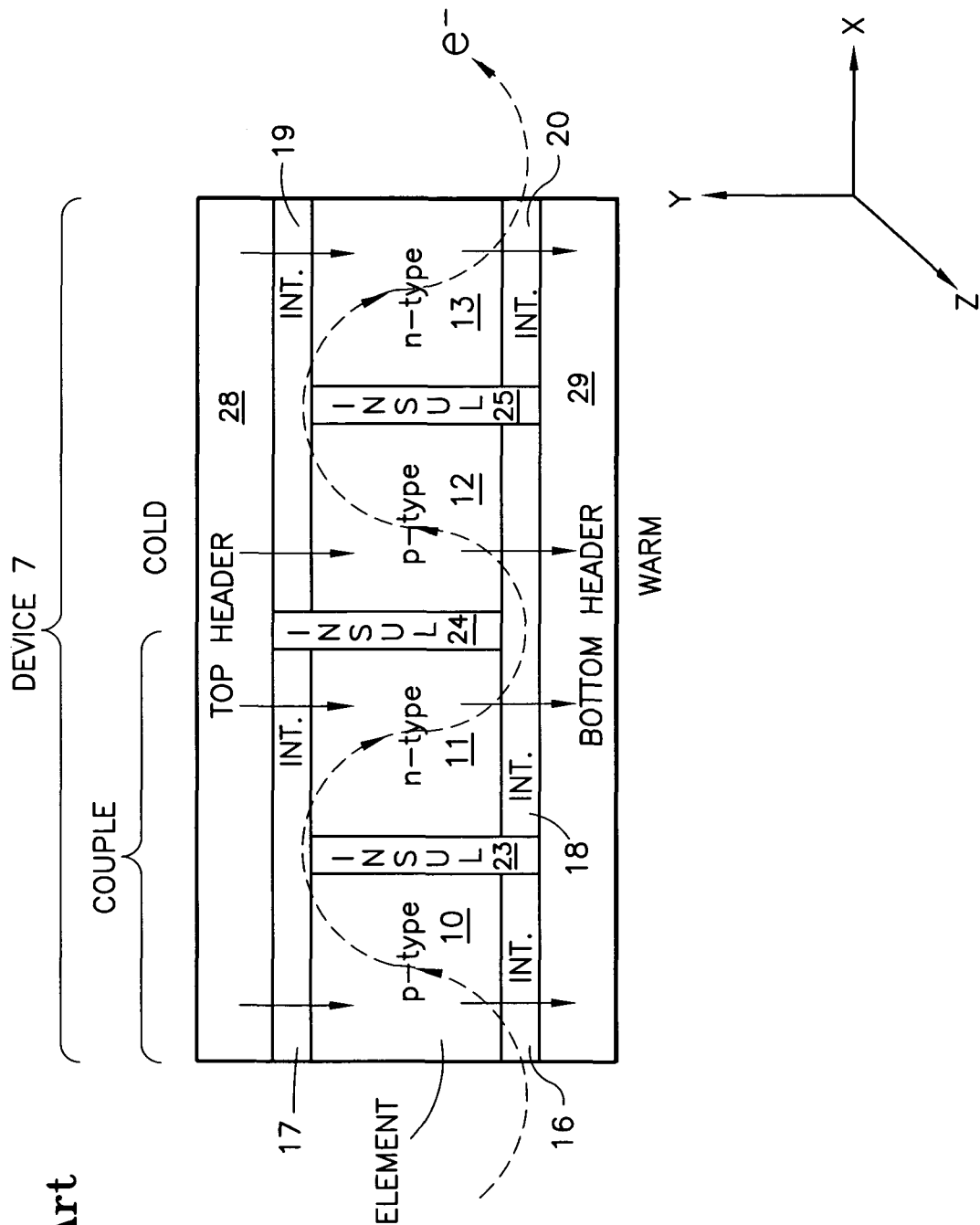
FIG. 1 is a simplified, stylized front elevation view, not to scale for clarity, of a thermoelectric device of the conventional configuration employing bulk elements, known to the art.

Referring to FIG. 1, a conventional thermoelectric device 7 includes a plurality of elements 10-13 each comprising a single thermoelectric alloy. The elements 10-13 are traditionally formed of Group V-VI semiconductor elements from the $Bi_2Te_3$—$Sb_2Te_3$—$Bi_2Se_3$ ternary system of materials. The alloy of the p-type elements 10, 12 may comprise, for instance, a ternary alloy of antimony, bismuth and tellurium, such as $Sb_{1.5}Bi_{0.5}Te_{3.0}$. The alloy of the n-type elements 11, 13 may comprise a ternary alloy of bismuth, tellurium and selenium, such as $Bi_2Te_{2.7}Se_{3.0}$. The bulk-material elements 10-13 may typically be approximately cubic in shape (not to be confused with cubic crystal structure), with between about 0.1 mm and 1.0 mm in each of the X, Y and Z directions.

The elements 10-13 are serially connected through interconnects (INT) 16-20. The upper interconnects 17, 19 are thermally and electrically insulated from the lower interconnects 16, 18 and 20 by insulation 23-25, which either may comprise space (typically wider than shown in FIG. 1) or may comprise material which is both thermally and electrically insulative.

The bulk device 7 of FIG. 1 will pump heat downwardly as shown by the solid arrows, in response to electron flow from left to right, in a serpentine fashion, as shown by dashed arrows in FIG. 1.

In such a device in which the elements are formed of thermoelectric material having a ZT of approximately 1.0, the device 7 will have a lower overall device ZT, such as about 0.7-0.9.

A top header 28 and a bottom header 29 must conduct heat while at the same time not electrically shorting the interconnects 16, 18; 17, 19; 18, 20. The constraint against electrical conduction provides a constriction to thermal conductivity which lowers the thermal transport capability of the headers 28, 29, particularly if they are ceramic. Also, the adherent between the interconnects and the headers, such as adhesive or solder, impedes thermal conductivity.

Figure 2:
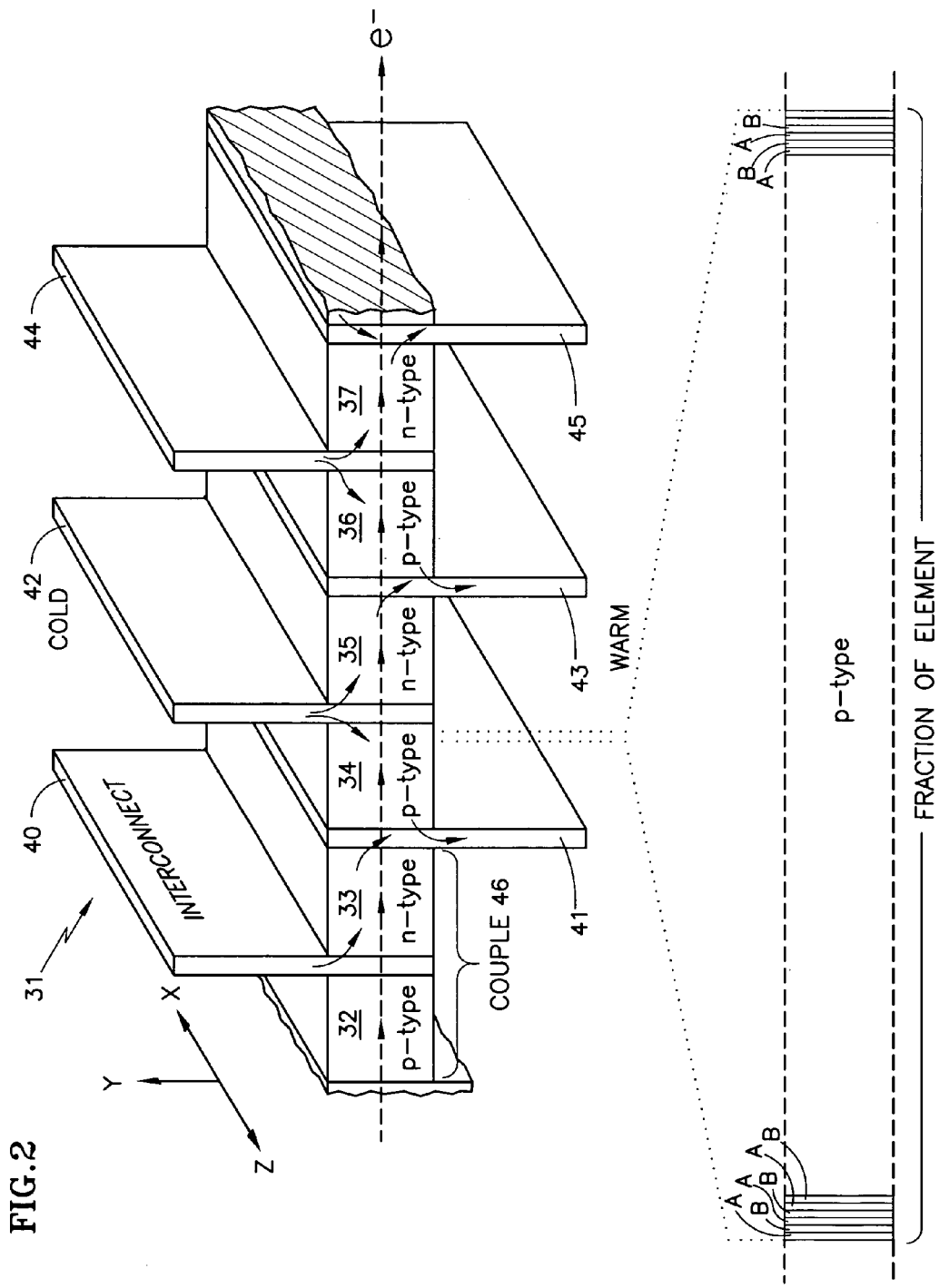
FIG. 2 is a partially expanded, front perspective view, not to scale for clarity, of a thermoelectric device in the configuration of alternating stacked n-type and p-type superlattice thin-film elements separated by interspersed interconnects, alternative ones of which extend in a direction opposite to the intermediate ones.

Referring to FIG. 2, a plurality of semiconductive thermoelectric elements 32-37 of alternating conductivity type are interleaved with a plurality of interconnects 40-45 which are both thermally and electrically conductive. The thin-film, super lattice elements 32-37 are shown very much larger than their real size in contrast with the size of the interconnects 40-45. Each of the elements 32-37 comprise many hundreds of pairs of n-type alloy A and n-type alloy B films or p-type alloy A and p-type alloy B films, of the type described hereinbefore. This is illustrated in the expansion of a fraction of an element shown in a lower part of FIG. 2.

Each film of alloy A or of alloy B (of either type) may be anywhere from 5 to 30 nanometers thick, grown epitaxially, as is known. While it is currently extremely difficult to produce superlattice film elements with thicknesses in excess of about 10 or 12 microns having the same ZT as is obtainable with film 5 microns thick, it is to be noted that the thicker the individual films, the higher the overall device ZT will be, up to an element thickness of about 25 or 40 microns. A typical element 32-37 may comprise on the order of 500 alloy A films and 500 alloy B films.

In FIG. 2, the heat flows from the upper part of the figure to the lower part of the figure (as shown by solid arrows) with an electron flow from the left of the figure toward the right of the figure (as shown by the dashed arrows).

Computer modeling has shown that a stacked device 31, utilizing traditional solder bonding at the intersection of each of the elements 32-37 with the corresponding interconnects 40-45 to form couples 46, can provide an overall device figure of merit of 0.92, utilizing elements 32-37 which individually have an element figure of merit of about 2.44 for p-type and about 1.6 for n-type, (together averaging about 2.0). This is an improvement of 0.42 compared with the device of FIG. 1.

For a device 31 employing solder bonding between the elements and the interconnects but having elements formed of alloy A and alloy B films that are each on the order of 20 microns thick, the overall device figure of merit increases from 0.92 to 1.28.

Diffusion bonding is a technique in which two metallic surfaces, at high temperature and pressure, in an inert or evacuated ambient, are united through inter-diffusion of surface atoms. When the interfaces of elements 32-37 are joined to related interconnects 40-45 by diffusion bonding, thereby eliminating solder, the overall device figure of merit improves to 1.45.

If diffusion bonding and 20 micron thick alloy films are both utilized in the device of FIG. 2, the overall device figure of merit increases to 1.69, which is believed to exceed that of any other device that has been reported.

Figure 3:
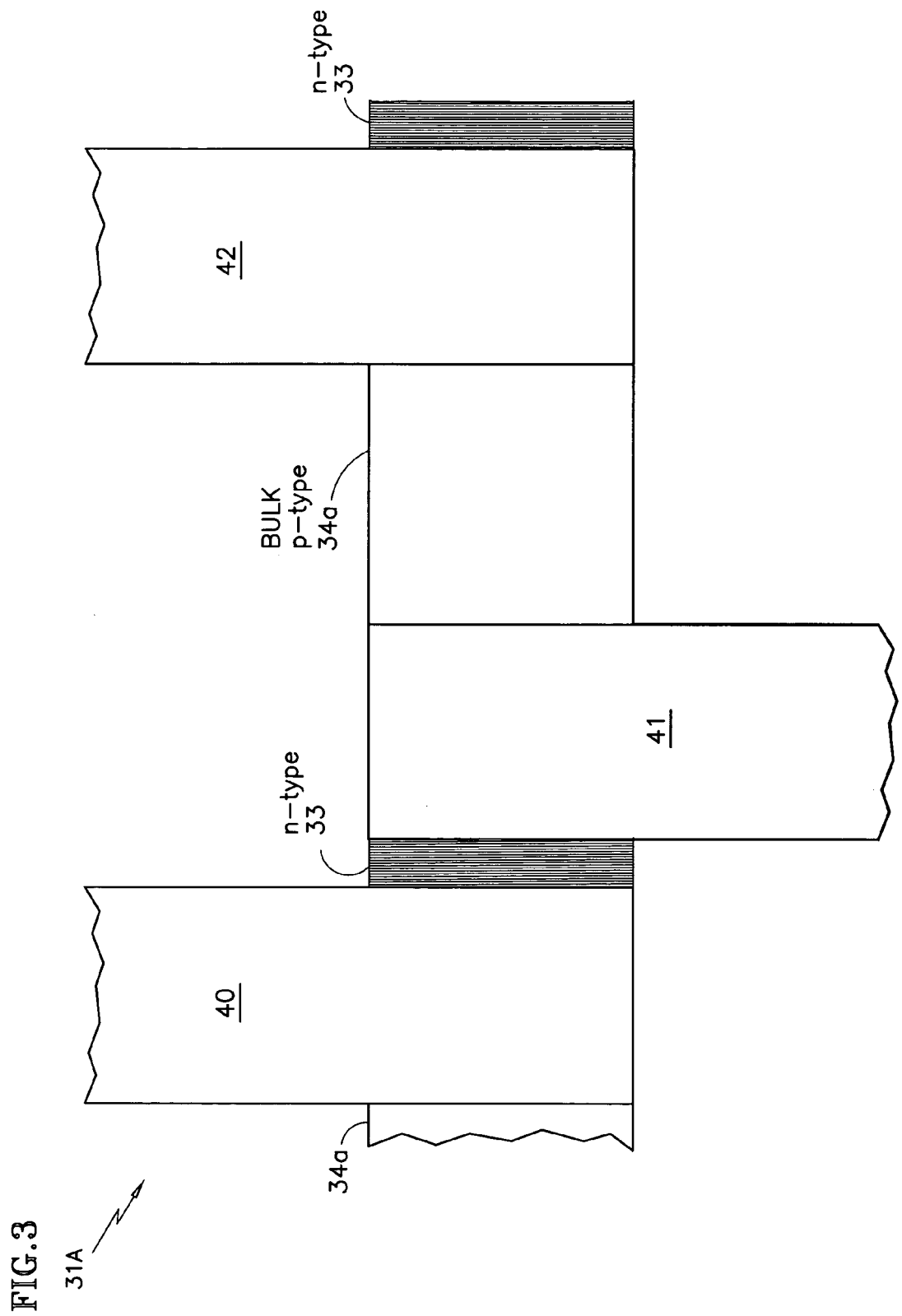
FIGS. 3 and 4 are simplified, stylized front elevation views of devices having thin-film elements interspersed with bulk elements.
Figure 4:
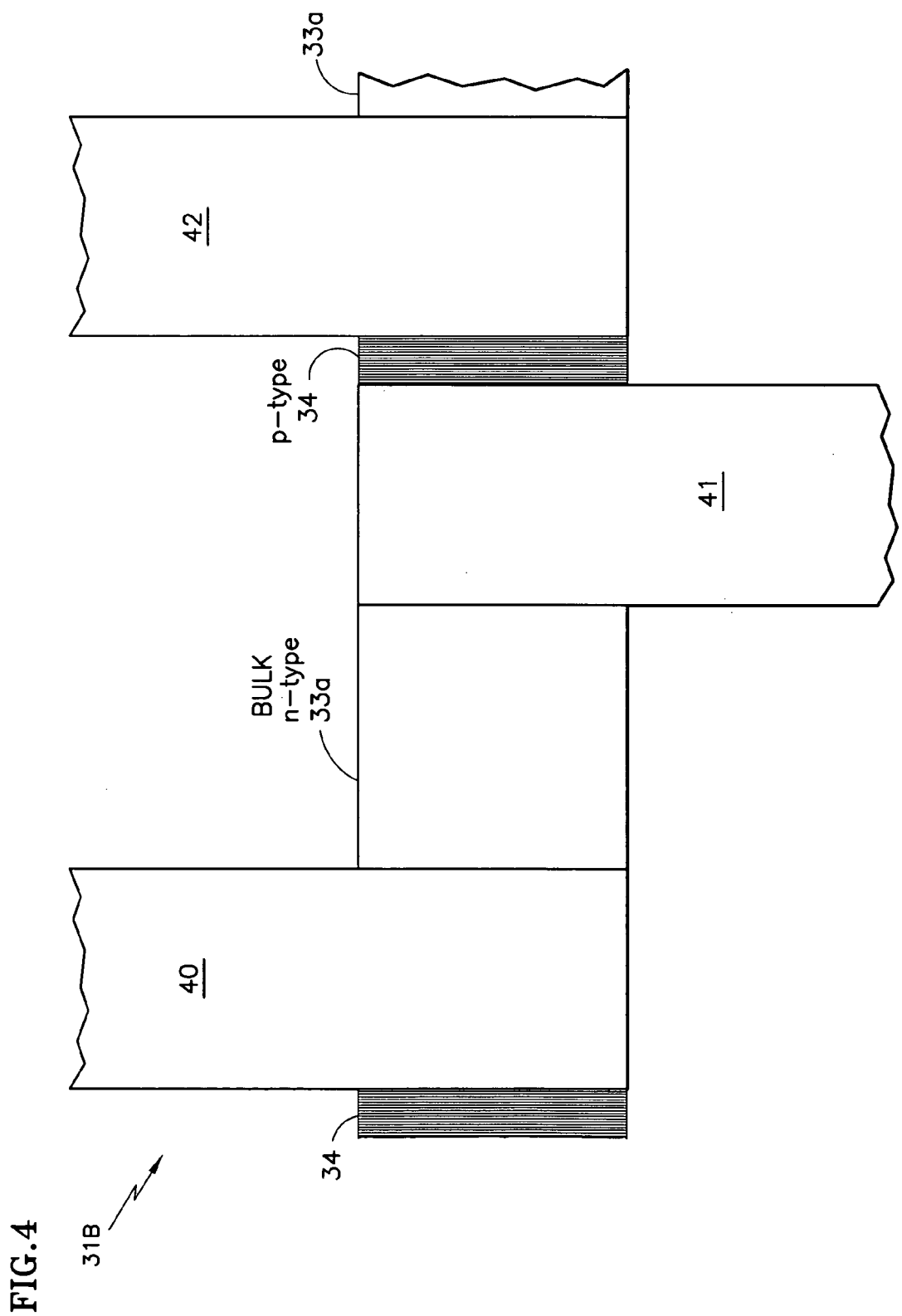

In FIGS. 3 and 4, hybrid devices are illustrated in which both bulk thermoelectric alloys and thin-film super lattice thermoelectric elements are used, in alternating positions. FIG. 3 illustrates a first example in which p-type bulk elements 34a are interspersed in a stack device with n-type thin-film super lattice elements 41. However, a more important hybrid device is illustrated in FIG. 4 in which p-type super lattice thin-film elements 34 are interspersed with bulk, n-type thermoelectric elements 33a. It has been found that a device made with p-type thin-film elements and n-type bulk elements can achieve an overall device figure of merit that is even higher than a stack device employing only thin-film elements. However, there is supposition that when the alloy films themselves become thicker, stack devices using only thin-film elements may have overall device figures of merit which meet or exceed the overall figures of merit of hybrid devices.

The bulk material utilized in either FIG. 3 or FIG. 4 may be homogeneous, or it may include bulk-nano material, that is, bulk material that contains and/or is made from nano particles. The bulk material may also be heterogeneous, having more than one composition dispersed throughout each element.

Thus, although exemplary embodiments have been show, it should be understood by those skilled in the art that the foregoing and various other changes, omissions and additions may be made therein and thereto, without departing from the spirit and scope thereof.

The invention claimed is:

1. A device (31, 31a, 31b) characterized by a plurality of thermoelectric alloy elements of the p-type (32, 34, 36) and of the n-type (33, 35, 37) arranged serially, the n-type being interspersed with the p-type, each n-type element being separated from an adjacent p-type element by a thermally and electrically conductive interconnect (40-45) which electrically and thermally connect each element with any adjacent element to form a couple (46), further characterized in that each interconnect is joined to corresponding elements (32-37, 33a, 34a) by diffusion bonding, each interconnect occupying the entire space between adjacent elements, each n-type element being contiguous with a first surface of a related interconnect, and each p-type element being contiguous with a second surface of the related interconnect which is opposite to the first surface, alternating interconnects extending away from said elements in opposite directions, such that the odd numbered interconnects (41, 43, 45) extend in one direction and the even numbered interconnects (40, 42, 44) extend in a second direction opposite said one direction, either (a) only said n-type elements or only said p-type elements or (b) both said n-type elements and said p-type are thin-film super lattice elements comprising many hundreds of thin-film layers (A, B) in which there are layers of first thermoelectric alloys interspersed with layers of second thermoelectric alloys, the thermoelectric alloys forming the layers in p-type elements being different from the thermoelectric alloys forming layers in n-type elements.

2. A device (31, 31a, 31b) according to claim 1 further characterized in that the alloys (A, B) forming alternate layers in p-type elements (32, 34, 36) comprise a binary alloy of bismuth and tellurium interspersed with a binary alloy of antimony and tellurium.

3. A device (31, 31a, 31b) according to claim 2 further characterized in that the alloys (A, B) forming alternate layers in p-type elements (32, 34, 36) comprise $Bi_2Te_3$ interspersed with $Sb_2Te_3$.

4. A device (31, 31a, 31b) according to claim 1 further characterized in that the alloys (A, B) forming alternate layers in n-type elements (33, 35, 37) comprise a binary alloy of bismuth and tellurium interleaved with a ternary alloy of bismuth, tellurium and selenium.

5. A device (31, 31a, 31b) according to claim 4 further characterized in that the alloys forming alternate layers in n-type elements comprise $Bi_2Te_3$ interleaved with $Bi_2Te_{2.7}Se_{0.3}$.

6. A device (31a, 31b) according to claim 1 further characterized in that either said n-type elements (33a) or said p-type elements (34a) are bulk elements.

7. A device (31b) according to claim 6 further characterized in that said bulk element (33a) is n-type formed of a ternary alloy of bismuth, tellurium and selenium.

8. A device (31b) according to claim 7 further characterized in that said alloy comprises $Bi_2Te_{2.7}Se_{3.0}$.

9. A device (31a) according to claim 6 further characterized in that said bulk element (34a) is p-type formed of a ternary alloy of antimony, bismuth and tellurium.

10. A device (31a) according to claim 9 further characterized in that said alloy comprises $Sb_{1.5}Bi_{0.5}Te_{3.0}$.

11. A device (31, 31a, 31b) according to claim 1 further characterized in that each thin-film super lattice element is between 5 microns and 25 microns thick, there being at least 500 layers of each alloy in each element.

12. A device (31, 31a, 31b) according to claim 1 further characterized in that each thin-film layer is between 10 microns and 20 microns thick, there being at least 500 layers of each alloy in each element.

13. A device (31, 31a, 31b) according to claim 1 further characterized in that each alloy layer is on the order of 5-40 nanometers thick, there being at least 500 layers of each alloy in each thin-film super lattice element.

14. A device (31, 31a, 31b) according to claim 1 further characterized in that said plurality of thermoelectric elements are grown epitaxially.

* * * * *